US006396698B1

(12) United States Patent
Holcombe (10) Patent No.: US 6,396,698 B1
(45) Date of Patent: May 28, 2002

(54) RETENTION MODULE ADAPTER

(75) Inventor: Brent A. Holcombe, Bellingham, WA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/764,522

(22) Filed: Jan. 18, 2001

(51) Int. Cl.[7] ................................................. H01K 7/20

(52) U.S. Cl. .................. 361/704; 361/702; 361/710; 361/712; 165/80.3; 165/185; 257/709; 257/713; 174/16.3

(58) Field of Search ................................. 361/702–712, 361/714–723, 760, 783, 816, 818, 820, 683, 773, 687–690, 740; 257/659, 660, 691, 778, 706–727; 165/80.2, 80.3, 80.4, 165, 185; 174/16.3, 35 R, 51, 260, 35 GC; 24/570, 573.1, 533–534, 598.1, 598.2; 248/505, 510; 439/377, 327, 928.1, 68, 70, 654; 324/537, 755

(56) References Cited

U.S. PATENT DOCUMENTS

| 4,859,189 | A | * | 8/1989 | Petersen et al. ............... 439/66 |
| 5,481,203 | A | * | 1/1996 | Appold ........................ 324/755 |
| 5,865,639 | A | * | 2/1999 | Fucihgami et al. .......... 439/330 |
| 6,250,375 | B1 | * | 1/2001 | Lee et al. .................... 165/80.3 |
| 6,205,026 | B1 | * | 3/2001 | Wong et al. ................. 361/704 |
| 6,243,265 | B1 | * | 6/2001 | Wong .......................... 361/704 |
| 6,339,533 | B1 | * | 1/2002 | Lee et al. .................... 361/704 |
| 6,341,065 | B1 | * | 1/2002 | Lo .............................. 361/704 |
| 6,343,017 | B1 | * | 1/2002 | Yu et al. ...................... 361/704 |

* cited by examiner

Primary Examiner—Darren Schuberg
Assistant Examiner—Michael Datskovsky
(74) Attorney, Agent, or Firm—Regan L. Trumper (57) ABSTRACT

A module retention adapter for attaching enabled heat sinks to the user target system while validating a processor with an LAI tool. In a preferred embodiment, the invention comprises an adapter and a clip. A user attaches an adapter to each retention module on a target system. Once a processor is loaded into the LAI tool and a heat sink solution is loaded onto the processor between the adapters. The heat sink clips are then clipped onto the adapters. The clips retain the heat sink to the adapters while also retaining the heat sink to the motherboard retention modules.

15 Claims, 4 Drawing Sheets

RETENTION MODULE ADAPTER

BACKGROUND

Adhesive and thermal grease are the standard alternatives for attaching enabled heat sinks to a user target system while validating a processor with An LAI tool. However, these methods are intrusive to the target system. Further, it does not allow the user to implement the enabled heat sink in alternative orientations in the validation chassis or validation platforms.

Alternatively, clips and retention modules are also used to secure an enabled heat sink to the processor. However, it requires the user to develop alternative clips and retention mechanisms customized to each board.

Often, a user has a requirement to validate a processor in alternative orientations. With such a requirement, thermal grease or adhesives make this unduly burdensome. In such a case, a user is forced to abandon the enabled heat sinking solution and develop alternative cooling methods to ensure reliable validation of the processor in that specific system. Developing alternative cooling methods is intrusive, expensive and often an unreliable means to ensure proper cooling of a processor.

SUMMARY

The invention allows a user to attach an enabled heat sink to an enabled retention module while using an interposing probe plugged into an electronic signal analyzer such as a logic analyzer or an oscilloscope. The invention also allows a user to attach an enabled heat sink to an enabled retention module while integrating various other interposing tools such as run control or thermal control. Further, the invention allows a user to attach an enabled heat sink using an enabled retention module at alternative orientations in a platform chassis without requiring adhesives, or alternative cooling solutions.

The present invention provides a retention module adapter for attaching enabled heat sinks to the user's target system while validating a processor with an LAI tool. In a preferred embodiment, the invention comprises an adapter and a clip. A user attaches an adapter to each of the retention modules on a target system. Once a processor is loaded into the LAI tool and a heat sink solution is loaded onto the processor between the adapters. The heat sink clips are then clipped onto the adapters. The clips retain the heat sink to the adapters while also retaining the heat sink to the motherboard retention modules. The clips alto secure the LAI tool to the motherboard.

DETAILED DESCRIPTION OF THE INVENTION

Figure 1:
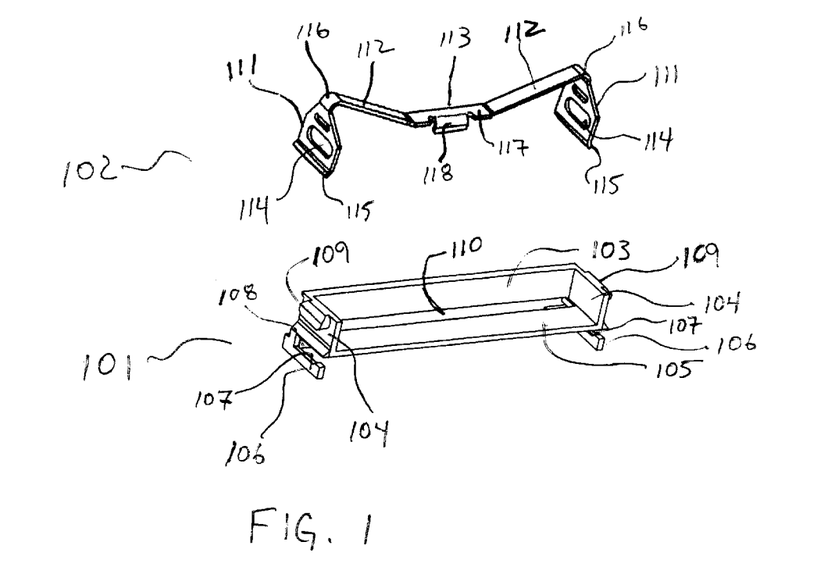
FIG. 1 shows a perspective view of a retention module adapter and a modified heat sink clip in accordance with the invention.

FIG. 1 shows a retention module adapter and a modified heat sink clip in accordance with the invention. The invention comprises a retention module adapter 101 and a modified heat sink clip 102.

In a preferred embodiment, the retention module adapter 101 is a single integrated unit comprising a back wall 103, a pair of side walls 104 and a lower wall 105. Below the lower wall is an insert section 106. The insert section 106 comprises a pair of reception opening 107 and a back buttress section 108. Preferably, the back buttress section 108 extends only partially inward from each side of the lower insert section 106. On each of said pair of side walls is a clip tab 109. Space 110 is present between the lower wall 105 and the back wall 103.

The modified heat sink clip 102 is a single integrated unit comprising a pair of side portions 111, a pair of inwardly extended flex arms 112 and a center support section 113. Each of the pair of side portions 111 comprises a tab receptor aperture 114 and an outwardly extending flange portion 115. The pair of side portions 111 connect to the inwardly extended flex arms 112 via a circular elbow 116. The center support section 113 extends between the inwardly extended flex arms 112. The center support section 113 comprises a flat portion 117 and a middle lip 118 extending downward from the flat portion 117.

Figure 2A:
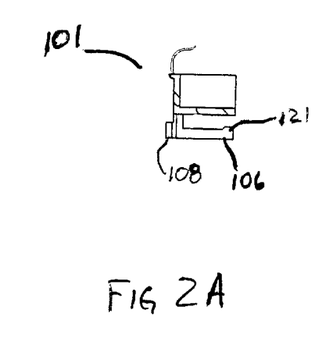
FIG. 2A shows a cutout side view of a retention module adapter in accordance with the invention.
Figure 2B:
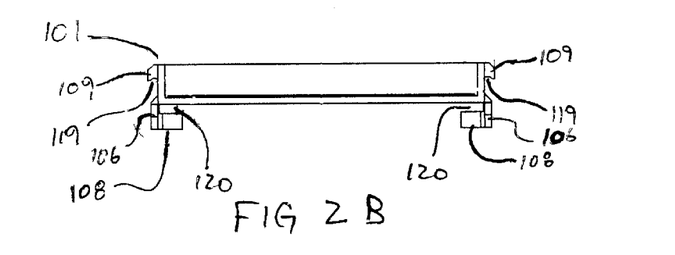
FIG. 2B is a back view of a retention module adapter in accordance with the invention.
Figure 2C:
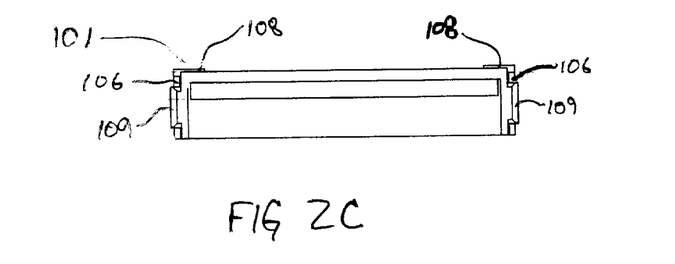
FIG. 2C is a bottom view of a retention module adapter in accordance with the invention.

FIGS. 2 A–C show three different views of the retention module adapter. FIG. 2A is a cutout side view of retention module adapter 101. FIG. 2B is a back view of retention module adapter 101. FIG. 2C is a bottom view of retention module adapter 101. Referring to FIGS. 2A–C, in a preferred embodiment of the invention, tabs 109 have notches 119. Notches 119 help secure the modified heat sink clip 102 when in operation. Buttresses 108 extend inward from the back portion of the insert portions 106. Further, buttresses 108 are offset from the backwall 103 and spaces 120 separate the buttresses from the lower wall 105. Spaces 120 allow a flexible circuit to pass through the adapter 101 when used in operation. The buttresses 108 limit the insertion depth and align the adapter 101 against an enable heat sink when used in operation.

In a preferred embodiment of the invention, the retention module adapter is a single unit comprised of a plastic or other material that is somewhat rigid yet provides enough flexibility to be inserted onto a heat sink module. More preferably, the adapter is constructed from a polycarbonate ABS plastic. The adapter is machined or injection molded.

In the preferred embodiment, the adapter 101 is 2.901 inches measured from the outer portion of the tabs 109. The thickness of the back wall 103, lower wall 105 and side walls 104 is from 0.053 inches to 0.056 inches. Reception opening 107 is 0.424 inches deep and approximately 0.121 inches from top to bottom. Reception opening 107 has a lip 121 that rises slightly. Lip 121 aids in securing the adapter 101 in place when in operation. The tabs 109 are sized to fit into the tab receptor apertures of the modified heat sink clip 102. Space 110 is approximately 0.142 inches from front to back and 2.616 inches wide.

Referring again to FIG. 1, the modified heat sink clip preferably comprises a singular steel structure. It is recognized that any material can be used for the modified heat sink clip 102 that provides a firm lock on a heat sink when used in operation and which provides sufficient flexibility for positioning and removal over the tabs 109 of the adapter 101. Also preferably, middle lip 118 extends approximately 0.12 to 0.13 inches downward from the flat portion 117 of the center support section 113. The flat portion 117 is approximately 0.9 inches from side to side and 0.14 inches from front to back. Flex arms 112 extend from the upper of the side portions 111 approximately at an angle of 70°. Flanges 115 extend from the side portions 111 approximately at an angle of 135°. Flanges 115 enable the modified heat sink clip to slide over tabs 109 with only a downward applied force. Flex arms 112 allow the modified heat sink clip 102 to flex when a downward force is applied to insert clip 102 over the retention module adapter 101.

Figure 3:
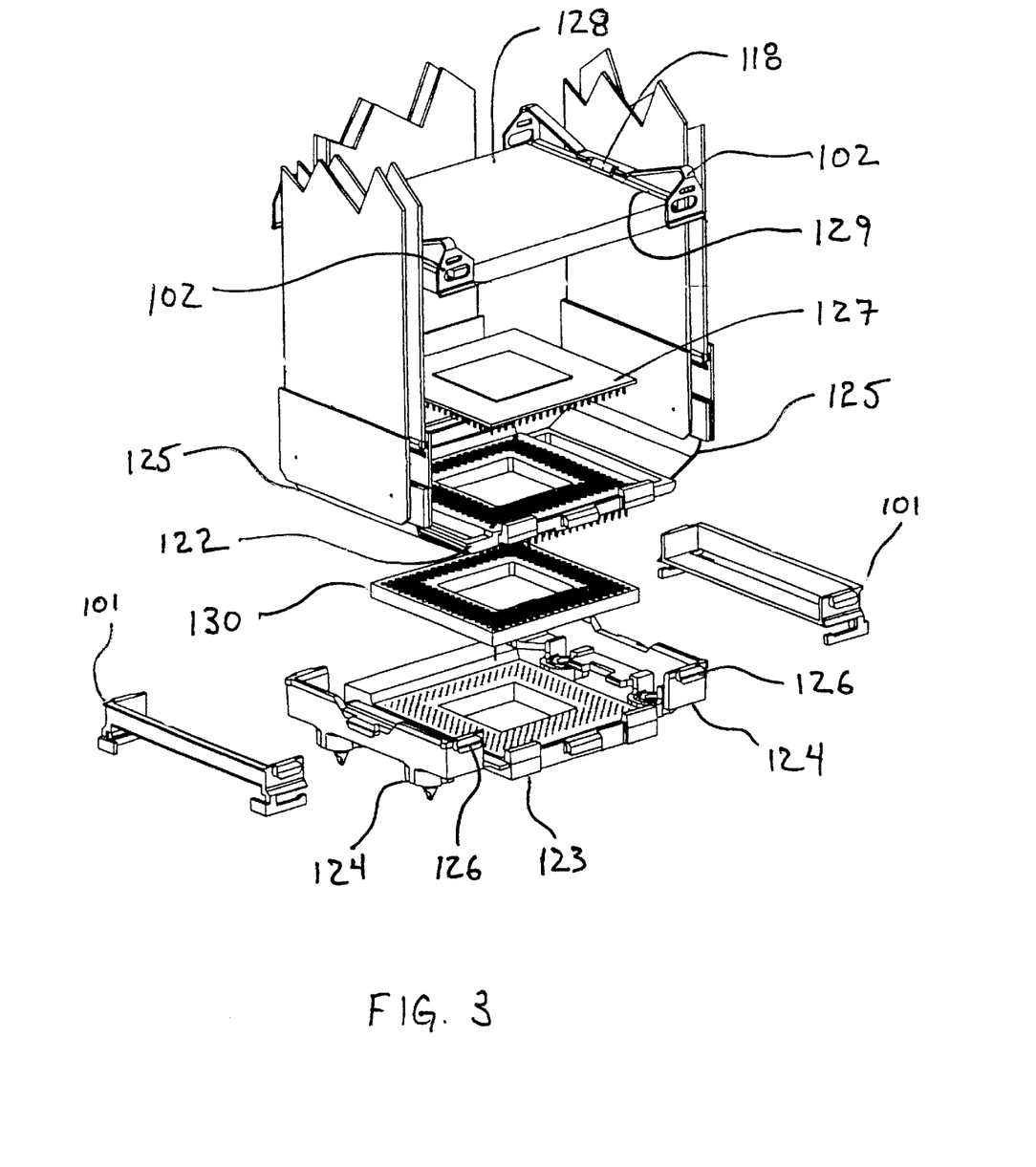
FIG. 3 is an exploded view of an embodiment of the invention in connection with a heat sink and interposing probe.

FIG. 3 shows an exploded view of a retention module with a preferred embodiment of the retention module adapter and modified heat sink clip of the invention. In operation, a user plugs an interposing probe 122 into a mother board socket 123 on a target system. A user then attaches the retention module adapter 101 to each retention module 124 on the target system in a manner that allows flexible circuit 125 to egress between the adapters 101 and the PC mother board retention module 124. Preferably, the retention module adapter 101 is attached by simply pushing it laterally onto the retention module 124. The retention module preferably has retention tabs 126 sized to allow the lip 121 of the adapter 101 to temporarily secure the adapter 101 in place. The flexible circuit 125 egresses through spaces 120 allowing the flexible circuit to connect to and LAI tool. The processor 127 is then loaded into the interposing probe 122. The heat sink solution 128 is next loaded onto the processor 127 between the retention module adapters 101. The heat sink solution 128 may or may not contact the lower wall 105 of the retention module adapters 101. Preferably, the heat sink solution is supported by the processor 127 and sits slightly above the retention module adapter. The heat sink solution 128 overlaps the retention module adapter 101. The modified heat sink clips 102 are then clipped onto the retention module adapter 101. Preferably, the heat sink solution 128 has grooves 129 that accept middle lip 118. When in operation, the modified heat sink clip 102 firmly holds the heat sink solution into place by locking onto tabs 109 and grooves 129. The modified heat sink clips 102 retain the heat sink solution 128 to the retention module adapters 101 while also retaining the heat sink 128 to the mother board retention modules 124.

Figure 4:
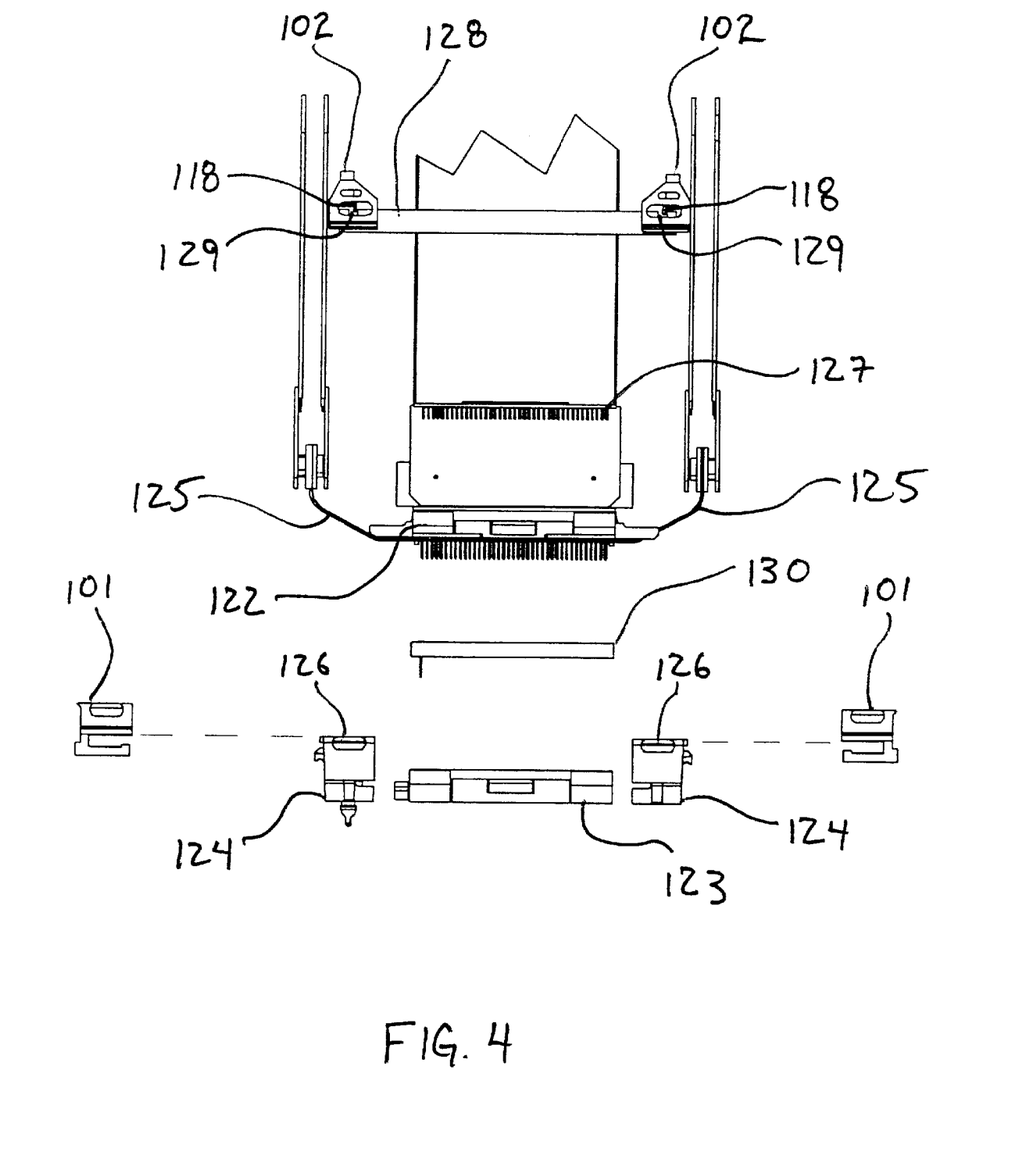
FIG. 4 is an exploded side view of an embodiment of the invention in connection with a heat sink and interposing probe.

FIG. 4 shows an alternate exploded side view of a preferred embodiment of the invention in connection with a retention module and heat sink solution. Interposing probe 122 plugs into a motherboard socket 123 on a target system. Offset 130 is provided to allow the flexible circuit to egress past the retention modules 124 without undue bending of the flexible cables. The retention module adapters 101 attach to the retention module 124 on the target system in a manner that allows flexible circuit 125 to egress between the adapters 101 and the PC mother board retention module 124. The retention module adapter 101 slides onto the retention module 124 after the interposing probe 122 has been inserted. The processor 127 is loaded by plugging it into the interposing probe 122 and the heat sink solution 128 is placed on top of the processor 127. The modified heat sink clips 102 attach the heat sink solution 128 to the retention module adapter 101 locking the interposing probe 122 to the target system motherboard.

Figure 5:
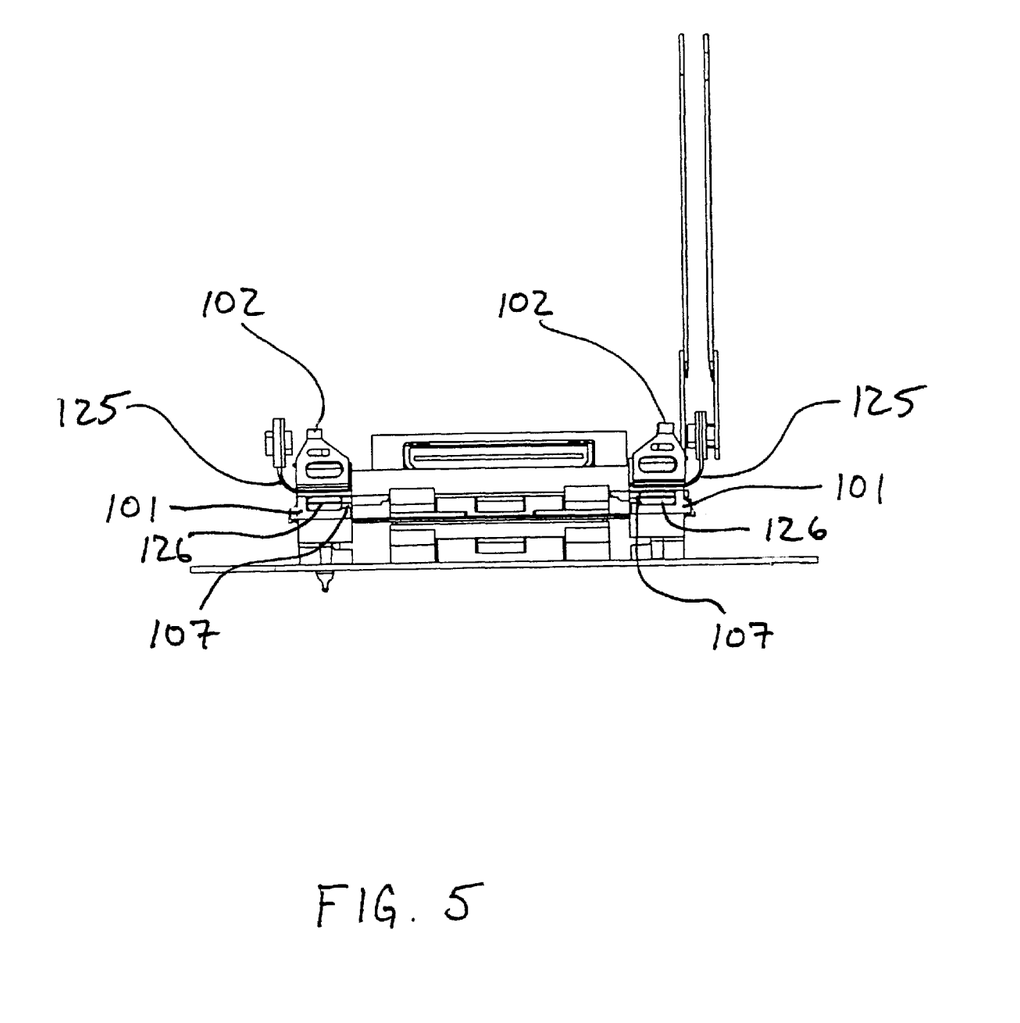
FIG. 5 is a side view of an embodiment of the invention in connection with a heat sink and interposing probe.

FIG. 5 shows a side view of a retention module adapter and modified heat sink clips in operation. Only one modified heat sink clip 102 is shown. Retention tabs 126 couple with apertures 107 with lip 121 holding retention module adapter 101 in place. The flexible circuit 125 egresses from under the retention module adapter 101. The modified heat sink clip 102 attaches to the retention module adapter 101. The modified heat sink clip 102 couples to the tab 109 and the notch (not shown) in the tab 109.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by any prior art.

What is claimed is:

1. A system for attaching a heat sink solution to a target system, said system "for attaching a heat sink"; comprising:
    a retention module adapter having a pair of clip tabs and being configured to slide onto a retention module on a motherboard; and
    a clip attaching said heat sink solution to said retention module adapter and locking said heat sink solution to an interposing probe which is plugged into a socket in said motherboard.

2. The system of claim 1, wherein said retention module adapter comprises:
    a back wall;
    a pair of side walls;
    a lower wall; and
    an insert section;
    wherein there is a space between said lower wall and said back wall.

3. The system of claim 2, wherein said insert section comprises a pair of reception openings and a back buttress section, said reception openings sized to couple with a pair of retention tabs on said retention module.

4. The system of claim 3, wherein said back buttress section extends only partially inward from said lower insert portions and wherein there is a space between said back buttress and said back wall.

5. The system of claim 4, wherein said heat sink clip comprises a pair of side portions, a pair of inwardly extended flex arms and a center support section, said flex arms being connected to said side portions and said support section extending between said flex arms.

6. The system of claim 5, wherein each of said pair of side portions has a bottom edge opposite said connection to said flex arms and comprises a tab receptor aperture and an outwardly extending flange portion at each bottom edge.

7. The system of claim 6, wherein said tab receptor apertures are sized to couple with said clip tabs.

8. The system of claim 7, wherein the pair of side portions connects to the inwardly extended flex arms by a circular elbow.

9. The system of claim 8, wherein said center support section comprises a flat portion and a middle lip extending downward from said flat portion.

10. The system of claim 9, wherein said middle lip couples with a groove in said heat sink.

11. The system of claim 9, wherein said clip tabs have an upper and a lower side, said lower side being grooved to receive said clip.

12. The system of claim 3, wherein said retention module comprises an integral body and is constructed from a polycarbonate ABS plastic.

13. The system of claim 12, wherein said polycarbonate ABS plastic is machined to form said retention module adapter.

14. The system of claim 12, wherein said polycarbonate ABS plastic is injection molded to form said retention module adapter.

15. A retention module adapter comprising:
  a back wall;
  a pair of side walls, each of said side walls having a clip tab;
  a lower wall; and
  an insert section, said insert section being on an opposite said of said lower wall from side walls and comprising a pair of reception openings and a back buttress section, said reception openings sized to couple with a pair of retention tabs on a retention module;
  wherein said back buttress section extends only partially inward from said lower insert portions and wherein there is a space between said back buttress and said back wall; and
  wherein said retention module adapter is slides onto said retention module and receives a heat sink clip coupled with said clip tabs.

* * * * *

UNITED STATES PATENT AND TRADEMARK OFFICE
CERTIFICATE OF CORRECTION

PATENT NO. : 6,396,698 B1
DATED : May 28, 2002
INVENTOR(S) : Brent A. Holcombe

It is certified that error appears in the above-identified patent and that said Letters Patent is hereby corrected as shown below:

Drawings,
Sheet 1 of 4, Informal Drawings
 Fig 1, 2A, 2B, 2C replace with Formal Drawings 1, 2A, 2B, 2C;
and
Sheet 2 of 4, Informal Drawing Fig 3 replace with Formal Drawing Fig 3; and
Sheet 3 of 4, Informal Drawing Fig 4 replace with Formal Drawing Fig 4; and
Sheet 4 of 4, Informal Drawing Fig 5 replace with Formal Drawing Fig 5.

Signed and Sealed this

Tenth Day of December, 2002

JAMES E. ROGAN
*Director of the United States Patent and Trademark Office*

(12) United States Patent
Holcombe (10) Patent No.: US 6,396,698 B1
(45) Date of Patent: May 28, 2002

(54) RETENTION MODULE ADAPTER

(75) Inventor: Brent A. Holcombe, Bellingham, WA (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 09/764,522

(22) Filed: Jan. 18, 2001

(51) Int. Cl.⁷ .................................................. H01K 7/20

(52) U.S. Cl. ............ 361/704; 361/702; 361/710; 361/712; 165/80.3; 165/185; 257/709; 257/713; 174/16.3

(58) Field of Search ......................... 361/702–712, 361/714–723, 760, 783, 816, 818, 820, 683, 773, 687–690, 740; 257/659, 660, 691, 778, 706–727; 165/80.2, 80.3, 80.4, 165, 185; 174/16.3, 35 R, 51, 260, 35 GC; 24/570, 573.1, 533–534, 598.1, 598.2; 248/505, 510; 439/377, 327, 928.1, 68, 70, 654; 324/537, 755

(56) References Cited

U.S. PATENT DOCUMENTS

| | | | | |
|---|---|---|---|---|
| 4,859,189 A | * | 8/1989 | Petersen et al. | 439/66 |
| 5,481,203 A | * | 1/1996 | Appold | 324/755 |
| 5,865,639 A | * | 2/1999 | Fucihgami et al. | 439/330 |
| 6,250,375 B1 | * | 1/2001 | Lee et al. | 165/80.3 |
| 6,205,026 B1 | * | 3/2001 | Wong et al. | 361/704 |
| 6,243,265 B1 | * | 6/2001 | Wong | 361/704 |
| 6,339,533 B1 | * | 1/2002 | Lee et al. | 361/704 |
| 6,341,065 B1 | * | 1/2002 | Lo | 361/704 |
| 6,343,017 B1 | * | 1/2002 | Yu et al. | 361/704 |

* cited by examiner

Primary Examiner—Darren Schuberg
Assistant Examiner—Michael Datskovsky
(74) Attorney, Agent, or Firm—Regan L. Trumper (57) ABSTRACT

A module retention adapter for attaching enabled heat sinks to the user target system while validating a processor with an LAI tool. In a preferred embodiment, the invention comprises an adapter and a clip. A user attaches an adapter to each retention module on a target system. Once a processor is loaded into the LAI tool and a heat sink solution is loaded onto the processor between the adapters. The heat sink clips are then clipped onto the adapters. The clips retain the heat sink to the adapters while also retaining the heat sink to the motherboard retention modules.

15 Claims, 4 Drawing Sheets